United States Patent [19]

Melisaris et al.

[11] Patent Number: 6,099,787
[45] Date of Patent: Aug. 8, 2000

[54] PROCESS FOR MAKING THREE-DIMENSIONAL ARTICLES BY STEREOLITHOGRAPHY

[75] Inventors: Anastasios P. Melisaris, Stevenson Ranch; Stephen D. Hanna, Santa Monica; Thomas H. Pang, Castaic, all of Calif.

[73] Assignee: Ciba Specialty Chemicals Corp., Tarrytown, N.Y.

[21] Appl. No.: 09/115,086

[22] Filed: Jul. 14, 1998

Related U.S. Application Data

[60] Provisional application No. 60/053,313, Jul. 21, 1997.

[51] Int. Cl.⁷ .............................. B29C 35/08; B29C 41/02
[52] U.S. Cl. .............................................. 264/401
[58] Field of Search ...................... 264/308, 401

[56] References Cited

U.S. PATENT DOCUMENTS

| | | | |
|---|---|---|---|
| 3,721,617 | 3/1973 | Watt | 522/32 |
| 4,575,330 | 3/1986 | Hull | 425/174.4 |
| 5,073,476 | 12/1991 | Meier et al. | 430/280.1 |
| 5,236,812 | 8/1993 | Vassiliou et al. | 430/327 |
| 5,783,358 | 7/1998 | Schulthess et al. | 430/269 |
| 5,807,519 | 9/1998 | Suzuki et al. | 264/401 |
| 5,863,486 | 1/1999 | Ozaki et al. | 264/401 |

FOREIGN PATENT DOCUMENTS

| | | |
|---|---|---|
| 0632111 | 1/1995 | European Pat. Off. . |
| 90/01512 | 2/1990 | WIPO . |
| 90/04211 | 4/1990 | WIPO . |
| 96/28763 | 9/1996 | WIPO . |
| 96/41238 | 12/1996 | WIPO . |
| 97/16401 | 5/1997 | WIPO . |
| 97/16466 | 5/1997 | WIPO . |

*Primary Examiner*—Leo B. Tentoni
*Attorney, Agent, or Firm*—David R. Crichton

[57] ABSTRACT

The present invention relates to a process for the production of three-dimensional articles by stereolithography using a radiation-curable composition having at least one cationically polymerizable compound and/or at least one free radical polymerizable compound, at least one filler material and at least one photoinitiator for cationic and/or radical polymerization. An organic viscosity stabilizer material is brought into contact with the composition to substantially delay or prevent undesirable viscosity increase and subsequently premature polymerization. A filler material is added to the composition in an effective amount to at least delay or prevent a significant increase in viscosity and polymerization.

22 Claims, No Drawings

PROCESS FOR MAKING THREE-DIMENSIONAL ARTICLES BY STEREOLITHOGRAPHY

This application claims the benefit under 35 U.S.C. 119(e) of U.S. Provisional Application No. 60/053,313, Filed Jul. 21, 1997.

The present invention relates to a process for the production of three-dimensional articles by stereolithography using a radiation-curable filled composition based on a cationically polymerizable compound and/or at least one free radical polymerizable compound, a filler material and at least one photoinitiator for cationic and/or radical polymerizations in which the composition is contacted by either an organic viscosity stabilizer material soluble in the base resin, or at least one filler material in a sufficient amount to at least delay or prevent a significant viscosity increase, and cured articles resulting from said process.

BACKGROUND OF THE INVENTION

Radiation-curable compositions comprising a cationically polymerizable compound and a photoinitiator for cationic polymerization are well-known in the industry and are used, for example, as radiation-curable paints, photoresists or for the production of three-dimensional articles by stereolithography. The photoinitiator for the cationic polymerization is formed in these compositions by a strong latent acid, i.e. a compound which undergoes a photoreaction on irradiation to form a strong acid, which then initiates the cationic polymerization.

In photohardenable cationically polymerizable compounds, the acid which is produced but is unable to cause significant gelation of the formulation, pose the greatest obstacle to compositional stability. Complications also occur when said radiation-curable compositions are used in practice, since the cationic polymerization commences prematurely, i.e. even before irradiation. This is generally due to premature formation of acids in the compositions. The undesired formation of acid can be due, for example, to decomposition of the photoinitiator for example owing to moisture, heat, unintentional exposure to light or scattered light, or by unintentional entrainment of acid. The undesirable formation of acid frequently causes such a large increase in the viscosity of the compositions that the composition becomes unuseable for its intended purpose.

An undesirable viscosity increase (viscosity destabilization problem) of this nature occurs frequently in the conventional production of three-dimensional articles by stereolithography using compositions based on a cationically polymerizable compound and a photoinitiator for cationic polymerization. In a stereolithographic process, as described in greater detail in U.S. Pat. No. 4,575,330, which is incorporated herein by reference, three-dimensional articles are built up in layers from the radiation-curable composition by first irradiating a layer of the composition imagewise. The composition is typically irradiated either simultaneously over the entire area or in a predetermined pattern (with raster or vectorial scanning) using a UV/VIS light source until the layer has solidified to a desired layer thickness in the irradiated areas. A new layer of the radiation-curable composition is then provided over the layer that has already been solidified. The new layer is similarly irradiated simultaneously over the entire area or in a predetermined pattern forming a second solidified layer adhering to the first.

This layering and irradiating operation is continued so that repeated covering of the previously solidified material with new layers of curable composition and subsequent irradiation of the new layer produces a three-dimensional article, also known as the "green part". The so-called "green part" is typically not fully cured, but is sufficiently solidified to withstand its own weight. The green part is removed from the bath containing the radiation-curable composition and may be post-cured, such as by the application of heat and/or further irradiation, to produce a final cured article or product.

After removal of the preform or green part, the stereolithography bath can be replenished with fresh curable composition and used for the production of an additional green part. It has been found that the cationically curable stereolithography baths, which, for economic reasons, are usually only replenished, exhibit an unacceptable increase in viscosity. An increase in viscosity is unacceptable due to the fact that the stereolithography part building parameters are originally determined for a specific properties of the material (e.g., narrow, specific viscosity range). As the viscosity gradually increases, new part building parameters must be continuously developed and optimized to achieve good part building. Unfortunately, the determination and optimization of stereolithography part building parameters is a long and costly process, and can be done only by highly specialized users.

Additionally, undesirable viscosity increase is detrimental to the building of articles having complex shapes. Complexly shaped articles can have, for example, narrow gaps, corners or internal cavities that are connected to the outside via a very small hole, from which high-viscosity material can not flow through to a sufficient extent.

A highly viscous or thixotropic composition also increases the time required for leveling of the top surface of the liquid composition in the bath. The increased time for leveling can significantly reduce the productivity of a stereolithographic device. Accordingly, improvements towards viscosity stabilization are of particular importance in the field of stereolithography.

In the past various resin stabilizers have been proposed. U.S. Pat. No. 3,721,617 by Watt proposes the use of various cyclic amide gelation inhibitors for epoxy resins. While these may be useful in some resins, it has been found that some of these cyclic amides, for example polyvinylpyrolidinone, significantly inhibit the polymerization of epoxy resins. Many bases are capable of neutralizing the acid generated as a result of thermal, hydrolytic or light activation. However, some bases are strong enough to cause reaction or polymerization (work as catalysts) and therefore are not useful as viscosity stabilizers.

The publication of a DuPont international patent application, WO96/41238 describes the use of a viscosity stabilizer having limited solubility in the composition and having a density which is different from that of the composition wherein, the stabilizer is a salt of a metal of Group IA, a metal of group IIA, ammonia or a substituted ammonia and a weak acid and wherein the stabilizer in the composition is present in an amount that is in excess of its solubility. The concentration of the stabilizer in the formulation is maintained by the presence of the salt in excess of its limited solubility. Preferred stabilizers, as shown therein, are salts of metals of Group IA and weak inorganic acids.

U.S. Pat. No. 5,073,476 mentions that in order to increase the resin capacity to be stored in the dark, the curable compositions can contain weak organic bases such as nitrites, amides, ureas. In order to prevent premature reaction caused by unintentional exposure, small amounts of UV absorbers and/or organic dyes can be added.

It is known that the addition of filler material, such as inorganic materials, ceramics, composites, metallic filler, organic polymeric, glass, thermoplastics, silica beads, etc. to radiation-curable compositions improves the majority of the mechanical and thermomechanical properties of resulting cured articles. The filler material may be either acidic or basic or neutral depending on the surface characteristics of the filler. The incorporation of a filler material or a mixture of fillers in radiation-curable compositions for use in stereolithography systems usually introduces viscosity destabilization problems in the overall composition.

The present invention overcomes the highly undesirable problems associated with viscosity destabilization (viscosity increase), particularly in filled compositions for use in stereolithographic systems.

SUMMARY OF THE INVENTION

A first aspect of the present invention relates to a process for the production of three-dimensional articles by stereolithography using a radiation-curable composition. The composition is a mixture of at least one cationically polymerizable compound and/or at least one radical polymerizable compound, at least one filler material and at least one photoinitiator for cationic and/or radical polymerizations. An organic viscosity stabilizer material is brought into contact with the composition in an effective amount to delay or prevent a significant viscosity increase of the overall composition. The organic stabilizer material is soluble in the base resin and is preferably a sterically hindered amine. Alternatively, at least one filler material is added that at least improves the viscosity stability of the overall composition. The cationically polymerizable compound in the radiation-curable composition can be at least one compound containing at least a 1,2-epoxide, vinyl ether, lactone, acetal, cyclic sulfide, cyclic ether or siloxane group.

A viscosity stabilizer, as the term is used herein, delays or prevents a significant increase in the viscosity of the overall composition that results from the presence of free acid in regions that are outside of the exposed or imaged regions of the stereolithographic composition. The phrase "delays a significant viscosity increase" means that the filled composition comprising the viscosity stabilizer remains stable and is acceptable for most stereolithographic applications throughout its shelf-life.

The concentration of the organic base stabilizer material in the overall composition is in the range of about 5 ppm by weight to 20% by weight depending on the strength of basicity, molecular weight, chemical structure and stereochemistry, as well as on the specific chemical structure and properties of the photoacid precursor, such as thermal stability, shelf-life, etc.

The radiation-curable composition can further include a compound that can cure by means of free radicals or a mixture of two or more of said free radically-polymerizable compounds, and a photoinitiator for free-radical polymerization.

At least one filler material can be surface treated, at least in part, with a compound-coupling agent that is either unreactive or capable of reacting when exposed to actinic radiation, cations, or free radicals.

A second aspect of the present invention relates to a process for the production of three-dimensional articles by stereolithography using a radiation-curable composition containing a mixture of at least one cationically polymerizable compound, at least one filler material in an amount sufficient to stabilize the viscosity of the overall composition and a photoinitiator for cationic polymerization. The cationically polymerizable compound in the radiation-curable composition can be at least one compound containing at least a 1,2-epoxide, a vinyl ether, lactone, acetal, cyclic sulfide, cyclic ether or siloxane group. The radiation-curable composition can further include a compound that can cure by means of free radicals or a mixture of two or more of said free radically-polymerizable compounds, and a photoinitiator for free-radical polymerization.

In a preferred embodiment of said second aspect, the present invention relates to a process for the production of three-dimensional articles by stereolithography using a radiation-curable composition comprising at least one radiation polymerizable compound and at least one surface treated filler, such that the surface treatment improves the compositional viscosity stability as compared to the mixture with the exception that the filler material has not been surface treated. The radiation-curable composition optionally further comprises at least one cationically polymerizable compound. The surface of the filler material is preferably treated with beta-(3,4-epoxycyclohexyl) ethyltrimethoxysilane, gamma-glycidoxypropyltrimethoxysilane and methyltriethoxysilane.

A third aspect of the present invention relates to a process for the production of three-dimensional articles by stereolithography using a radiation-curable composition containing a mixture of at least one cationically polymerizable compound, at least one filler material having a pH value equal to or greater than about 9 and optionally, at least one filler having a pH value less than about 9 and a photoinitiator for cationic polymerization. The cationically polymerizable compound in the radiation-curable composition may be at least one compound containing a 1,2-epoxide, at least one vinyl ether, lactone, acetal, cyclic sulfide, cyclic ether or siloxane group. The radiation-curable composition may further include a compound that can cure by means of free radicals or a mixture of two or more of said free radically-polymerizable compounds, and a photoinitiator for free-radical polymerization. The at least one filler material can be surface treated, at least in part, with a compound-coupling agent that is either unreactive or capable of reacting when exposed to actinic radiation, cations or free radicals. An organic base viscosity stabilizer material may be brought into contact with the composition.

A fourth aspect of the present invention relates to cured three-dimensional articles produced by stereolithography by subjecting a radiation-curable composition containing a mixture of at least one cationically polymerizable compound, at least one filler material, a photoinitiator for cationic polymerization and an organic base stabilizer material, to actinic radiation.

A fifth aspect of the present invention relates to cured three-dimensional articles produced by stereolithography by subjecting a radiation-curable composition comprising a mixture of at least one cationically polymerizable compound, at least one filler in an amount effective to delay or prevent a significant viscosity increase and a photoinitiator for cationic polymerization, to actinic radiation.

A sixth aspect of the present invention relates to a process for manufacturing a stabilized filled resin composition for stereolithography by combining a mixture of at least one cationically polymerizable compound, at least one filler material, a photoinitiator for cationic polymerization and an organic base stabilizer material, in a reaction vessel.

A seventh aspect of the present invention relates to a process for manufacturing a stabilized filled resin composition for stereolithography by combining a mixture of at least one cationically polymerizable compound, at least one filler material in an amount effective to delay or prevent a significant viscosity increase, and a photoinitiator for cationic polymerization, in a reaction vessel.

An eighth aspect of the present invention relates to a stabilized radiation-curable composition comprising a mixture of at least one radiation polymerizable compound, at least one filler material, at least one photoinitiator for polymerization, and an organic base, viscosity stabilizer material in an effective amount to delay or prevent a significant increase in viscosity of the overall composition.

A ninth aspect of the present invention relates to stabilized radiation-curable composition comprising a mixture of at least one radiation polymerizable compound, at least one filler material in an amount effective to delay or prevent a significant viscosity increase and at least one photoinitiator for polymerization.

A tenth aspect of the present invention relates to a stabilized radiation-curable composition comprising a mixture of at least one cationically polymerizable compound and/or at least one free radically polymerizable compound, at least one filler material having a pH value equal to or greater than about 9 and optionally at least one filler material having a pH value less than about 9 and at least one photoinitiator for cationic and/or radical polymerizations.

These and other aspects of the invention can be practiced alone or in combination. Other aspects of the invention will be apparent to those of skill in the art upon the review of the teachings herein.

DETAILED DESCRIPTION OF THE INVENTION

The radiation-curable compositions for which the viscosity stabilization process is suitable can contain any conventional cationically polymerizable organic compounds, either alone or in the form of a mixture with at least one further compound which can be polymerized cationically or by another mechanism, for example by means of free radicals. These include, for example, ethylenically unsaturated compounds which can be polymerized by a cationic mechanism, such as monoolefins and diolefins, for example isobutylene, butadiene, isoprene, styrene, α-methylstyrene, divinylbenzenes, N-vinylpyrrolidone, N-vinylcarbazole and acrolein, or vinyl ethers, for example methyl vinyl ether, isobutyl vinyl ether, trimethylolpropane trivinyl ether, ethylene glycol divinyl ether; cyclic vinyl ethers, for example 3,4-dihydro-2-formyl-2H-pyran (dimeric acrolein) and the 3,4-dihydro-2H-pyran-2-carboxylic ester of 2-hydroxymethyl-3,4-dihydro-2H-pyran, and vinyl esters, for example vinyl acetate and vinyl stearate. They can also be cationically polymerizable heterocyclic compounds, for example ethylene oxide, propylene oxide, epichlorohydrin, glycidyl ethers or monohydric alcohols or phenols, for example n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetanes, such as 3,3-dimethyloxetane and 3,3-di(chloromethyl)oxetane; tetrahydrofuran; dioxolanes, trioxane and 1,3,6-trioxacyclooctane; lactones, such as β-propiolactone, γ-valerolactone and ε-caprolactone; spiroether carbonates spiroether esters; thiiranes, such as ethylene sulfide and propylene sulfide; epoxy resins; linear and branched polymers containing glycidyl groups in the side chains, for example homopolymers and copolymers of polyacrylate and polymethacrylate glycidyl esters. Other suitable cationically polymerizable compounds are methylol compounds, which include amino resins, for example the N-hydroxymethyl-, N-methoxymethyl-, N-n-butoxymethyl- and N-acetoxymethyl derivatives of amides or amide-like compounds, for example cyclic ureas, such as ethyleneurea (imidazolidin-2-one), hydantoin, urone (tetrahydrooxadiazin-4-one), 1,2-propyleneurea (4-methylimidazolidin-2-one), 1,3-propyleneurea (hexahydro-2H-pyrimid-2-one), hydroxypropyleneurea (5-hydroxyhexahydro-2H-pyrimid-2-one), 1,3,5-melamine and further polytriazines, such as acetoguanamine, benzoguanamine and adipoguanamine. If desired, use can also be made of amino resins containing both N-hydroxymethyl and N-acetoxymethyl groups, for example hexamethylolmelamin, in which 1 to 3 of the hydroxyl groups have been etherified by means of methyl groups. Other suitable methylol compounds are phenolic resins, in particular resols prepared from a phenol and an aldehyde. The phenols which are suitable for this purpose include phenol itself, resorcinol, 2,2-bis(p-hydroxyphenyl)propane, p-chlorophenol, a phenol which is substituted by one or two alkyl groups each having 1 to 9 carbon atoms, such as o-, m- or p-cresol, the xylenols, p-tert-butylphenol and p-nonylphenol, and also phenyl-substituted phenols, in particular p-phenylphenol. The aldehyde condensed with the phenol is preferably formaldehyde, but other aldehydes, such as acetaldehyde and furfural, are also suitable. If desired, a mixture of such curable phenol-aldehyde resins can be used.

Particularly important cationically polymerizable compounds are epoxy resins having on average more than one 1,2-epoxide group in the molecule. Such resins can have an aliphatic, aromatic, cycloaliphatic, araliphatic or heterocyclic structure; they contain epoxide groups as side groups, or these groups form part of an alicyclic or heterocyclic ring system. Epoxy resins of these types are known in general terms and are commercially available. The following may be mentioned by way of examples of epoxy resins of this type:

I) Polyglycidyl and poly(β-methylglycidyl) esters obtainable by reacting a compound containing at least two carboxyl groups in the molecule and epichlorohydrin or glycerol dichlorohydrin or β-methylepichlorohydrin. The reaction is expediently carried out in the presence of bases. The compounds containing at least two carboxyl groups in the molecule can be, for example, aliphatic polycarboxylic acids. Examples of these polycarboxylic acids are glutaric acid, adipic acid, pimelic acid, suberic acid, azelaic acid, sebacic acid or dimerized or trimerized linoleic acid. However, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids, for example phthalic acid, isophthalic acid, trimellitic acid or pyromellitic acid. Use can also be made of carboxyl-terminated adducts, for example of trimellitic acid and polyols, for example glycerol or 2,2-bis(4-hydroxycyclohexyl)propane.

II) Polyglycidyl or poly(β-methylglycidyl) ethers obtainable by reacting a compound containing at least two free alcoholic hydroxyl groups and/or phenolic hydroxyl groups and a suitably substituted epichlorohydrin under alkaline conditions, or in the presence of an acidic catalyst followed by treatment with alkali. Ethers of this type are derived, for example, from acyclic alcohols, such as ethylene glycol, diethylene glycol and higher poly(oxyethylene)glycols, propane-1,2-diol, or poly(oxypropylene)glycols, propane-1, 3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. However, the ethers can also be derived from cycloaliphatic alcohols, such as 1,3- or 1,4-dihydroxycyclohexane, bis(4-hydroxycyclohexyl)methane, 2,2-bis(4-hydroxycyclohexyl) propane or 1,1-bis(hydroxymethyl)cyclohex-3-ene, or they contain aromatic rings, such as N,N-bis(2-hydroxyethyl) aniline or p,p'-bis(2-hydroxyethylamino)diphenylmethane. Glycidyl ethers can also be derived from monocyclic phenols, for example from resorcinol or hydroquinone, or they can be based on polycyclic phenols, for example on bis(4-hydroxyphenyl)methane (bisphenol F), 2,2-bis-(4-hydroxyphenyl)propane (bisphenol A), or condensation products, obtained under acidic conditions, of phenols or cresols with formaldehyde, such as phenol-novolaks and cresol-novolaks.

III) Poly-(N-glycidyl) compounds are obtainable, for example, by dehydrochlorination of the products of the reaction of epichlorohydrin with amines containing at least two amine hydrogen atoms. These amines are, for example, n-butylamine, aniline, toluidine, m-xylylenediamine, bis(4-aminophenyl)methane or bis(4-methylaminophenyl) methane. However, the poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

IV) Examples of suitable poly(S-glycidyl) compounds are di-S-glycidyl derivatives derived from dithiols, for example ethane-1,2-dithiol or bis(4-mercaptomethylphenyl) ether.

V) Examples of epoxide compounds in which the epoxide groups form part of an alicyclic or heterocyclic ring system are, for example, bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methanediglycidyl ether, 2,2-bis(4-hydroxycyclohexyl) propanediglycidyl ether, 3,4-epoxycyclohexylmethyl 3,4-epoxycyclohexanecarboxylate, 3,4-epoxy-6-methylcyclohexylmethyl 3,4-epoxy-6-methylcyclohexanecarboxylate, di(3,4-epoxycyclohexylmethyl)hexanedioate, di(3,4-epoxy-6-methylcyclohexylmethyl) hexanedioate, ethylenebis(3,4-epoxycyclohexanecarboxylate), ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

However, it is also possible to use epoxy resins in which the 1,2-epoxide groups are bonded to different heteroatoms or functional groups. These compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane. Also suitable are liquid prereacted adducts of such epoxy resins with curing agents for epoxy resins.

The photoinitiators for cationic polymerization can likewise be all compounds known for this purpose in the art. These include, for example, onium salts with anions of low nucleophilicity. Examples thereof are halonium salts, iodosyl salts or sulfonium salts, as described in EP-A153904, sulfoxonium salts, as described, for example, in EP-A35969, 44274, 54509 and 164314, or diazonium salts, as described, for example, in U.S. Pat. No. 3,708,296, each of which are incorporated herein by reference. Further cationic photoinitiators are metallocene salts, as described, for example, in EP-A94914 and 94915. A review of further common onium salt initiators and/or metallocene salts is given in "UV-Curing, Science and Technology", (Editor: S. P. Pappas, Technology Marketing Corp., 642 Westover Road, Stamford, Ct.) or "Chemistry & Technology of UV & EB Formulations for Coatings, Inks and Paints", Vol. 3 (edited by P. K. T. Oldring), which are incorporated herein by reference.

Particularly suitable photoinitiators for the cationic polymerization are compounds of the formulae (1), (2) and (3)

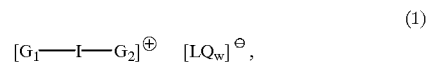

(1)

(2)

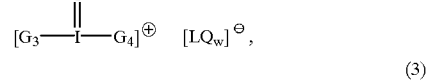

(3)

in which $G_1$, $G_2$, $G_3$, $G_4$, $G_5$, $G_6$ and $G_7$, are $C_6$–$C_{18}$aryl which is unsubstituted or substituted by suitable radicals, L is boron, phosphorus, arsenic or antimony, Q is a halogen atom or a part of the radicals Q in an anion $LQ_w^-$ can also be a hydroxyl group, and w is an integer corresponding to the valency of L plus 1. Examples of $C_6$–$C_{18}$aryl here are phenyl, naphthyl, anthryl and phenanthryl. Substituents which may be present on suitable radicals are alkyl, preferably $C_1$–$C_6$alkyl, such as methyl, ethyl, n-propyl, isopropyl, n-butyl, sec-butyl, isobutyl, tert-butyl and the various pentyl and hexyl isomers, alkoxy, preferably $C_1$–$C_6$alkoxy, such as methoxy, ethoxy, propoxy, butoxy, pentoxy and hexoxy, alkylthio, preferably $C_1$–$C_6$alkylthio, such as methylthio, ethylthio, propylthio, butylthio, pentylthio and hexylthio, halogen, such as fluorine, chlorine, bromine and iodine, amino groups, cyano groups, nitro groups and arylthio, such as phenylthio. Examples of particularly advantageous halogen atoms Q are chlorine and in particular fluorine, examples of anions $LQ_w^-$ are, in particular, $BF_4^-$, $PF_6^-$, $AsF_6^-$, $SbF_6^-$ and $SbF_5(OH)^-$. The anion of the type $LQ_w^-$ can also advantageously be replaced by $CF_3SO_3^-$. Compounds containing two or more onium groups in the molecule, for example disulfonium compounds, are of course also suitable as initiators. Particularly frequent use is made of cationic photoinitiators of the formula (3) in which $G_5$, $G_6$ and $G_7$ are phenyl or biphenyl, or mixtures of these two compounds.

A further important type of cationic photoinitiators has the formula (4)

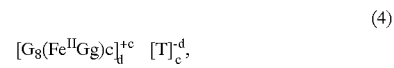

(4)

in which c is 1 or 2, d is 1, 2, 3, 4 or 5, T is a non-nucleophilic anion, for example $BF_4^-$, $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$, n-$C_8F_{17}SO_3^-$, $C_6F_5SO_3^-$, phosphorus tungstate ($PO_{40}W_{12}^{3-}$) or silicon tungstate ($SiO_{40}W_{12}^{4-}$), $G_8$ is a π-arene, and $G_9$ is an anion of a π-arene, in particular a cyclopentadienyl anion. Examples of π-arenes $G_8$ and anions of π-arenes $G_9$ which are suitable here are given in EP-A94915. Important π-arenes $G_8$ are toluene, xylene, ethylbenzene, cumene, methoxybenzene, methylnaphthalene, pyrene, perylene, stilbene, diphenylene oxide and diphenylene sulfide. Particular preference is given to cumene, methylnaphthalene and stilbene. The anion T is in particular $PF_6^-$, $AsF_6^-$, $SbF_6^-$, $CF_3SO_3^-$, $C_2F_5SO_3^-$, $n\text{-}C_3F_7SO_3^-$, $n\text{-}C_4F_9SO_3^-$, $n\text{-}C_6F_{13}SO_3^-$ or $n\text{-}C_8F_{17}SO_3^-$. The ferrocene salts, like metallocene salts, can generally also be employed in combination with oxidants. Such combinations are described in EP-A126712.

The cationic photoinitiators can of course be added in the conventional effective amounts, for example in each case in amounts of from about 0.1 to 20 percent by weight, preferably from 1 to 10 percent by weight, based on the total amount of the mixture. In order to increase the light yield, sensitizers can also be employed, depending on the initiator type. Examples thereof are polycyclic aromatic hydrocarbons and aromatic keto compounds. Specific examples of preferred sensitizers are mentioned in EP-A153904.

The filler material can be organic or inorganic. Examples of organic filler materials are polymeric compounds, thermoplastics, aramid, KEVLAR®, core-shell resins, crosslinked polystyrene, crosslinked poly(methyl methacrylate), polystyrene or polypropylene. Examples of inorganic fillers are glass or silica beads, glass or silica bubbles, glass or silica powder, amorphous silica, crystalline silica, calcium carbonate, barium sulfate, talc, mica, metallic filers, ceramics and composites. Mixtures of organic and/or inorganic fillers can be used. Examples of preferred fillers are microcrystalline silica, crystalline silica, amorphous silica, synthetic silica, wolastonite, alkali aluminosilicates, feldspar, surface treated feldspar, alumina trihydrate, surface treated alumina trihydrate, kaoline, modified kaolin, and hydrated kaolin. Examples of commercially available products include Imsil, available from Unimin Corp., Elco, Ill., Novasite and Novakup, available from Malvern Minerals, surface treated and untreated feldspar, available from K-T Feldspar, Spruce Pine, N.C., and alumina trihydrate, available from Alcan Chemicals, Cleveland, Ohio. The most preferred filler materials are inorganic fillers, such as sodium, potassium, calcium, aluminum silicate or aluminum oxide or alumina trihydrate.

A mixture of acidic filler materials, basic filler materials, and neutral filler materials can be used. Further, a mixture of at least one acidic, and/or at least one basic, and/or at least one neutral filler materials can be incorporated into the composition mixture. The pH value for the filler materials can be determined by preparing an aqueous slurry suspension of filler and are conventionally commercially indicated as being based on a concentration of filler between 5–10% by weight.

The filler material can be surfaced treated with coupling agents-compounds that are either unreactive or capable of reacting when subjected to actinic and/or free radical polymerization. For example, the filler material can be surfaced treated with methacryloxypropyltrimethoxysilane, beta-(3, 4-epoxycyclohexyl)ethyltrimethoxysilane, gamma-glycidoxypropyltrimethoxysilane, methyltriethoxysilane, octyltriethoxysilane, vinyltriethoxysilane. The most preferred surface treatments use beta-(3,4-epoxycyclohexyl) ethyltrimethoxysilane, gamma-glycidoxypropyltrimethoxysilane and methyltriethoxysilane. With respect to surface treated filler material, the pH value for the filler material is determined prior to any surface treatment operations.

The filler loading is preferably from about 2 to about 90%, more preferably from about 5 to about 50%, most preferably from about 5 to about 40% by weight with respect to the total weight of the filled resin composition.

Incorporation of the appropriate organic base or nucleophile into the filled composition, as a viscosity stabilizer, will neutralize the acid, and prevent premature polymerization. The organic viscosity stabilizer material is particularly useful when one or more of the filler materials in the composition mixture causes undesired viscosity increase. The organic viscosity stabilizer material is soluble in the base resin and is preferably selected from the group consisting of nitrogen-containing organic compounds that more preferably have steric hindering groups on or near the nitrogen atom(s). Without intending to be bound to any particular technical theory, the steric hindrance is believed to prevent significant nucleophilic attack on the epoxy monomers. The organic viscosity stabilizer material, however, must still have sufficient basicity to effectively neutralize any prematurely generated acid. The organic viscosity stabilizer material should be used at very small levels in order to function as a viscosity stabilizer. At higher levels, it works as a catalyst that polymerizes the stereolithography resin.

The organic bases or nucleophiles, viscosity stabilizer materials, can be polymerizable or non-polymerizable. Examples of such stabilizers are urethane acrylates, nitrogen-containing epoxies, polyimides, pyridines, phenalthrolines, pyrimidines, pyrazines, imidazoles, triazoles, pyridazines, indoles, etc. primary, secondary and tertiary amines, porphins, hydrazines, ureas, nitrites, isonitriles, cyanates, and amides. Preferred stabilizers are sterically hindered tertiary amines, lactones, amides and urea derivatives. Most preferred are benzyl-N,N-dialkyl-amines and N,N-dialkyl-N-aryl-amines.

The concentration of the organic base or nucleophile, viscosity stabilizer material is highly dependent on the strength of basicity, chemical structure, molecular weight and stereochemistry of the stabilizer, as well as on the specific chemical structure, and properties of the photoacid precursor, such as thermal stability, shelf-life, etc. Typically, the lower the shelf-life and thermal and hydrolytic stability of the photoacid precursor, the higher the concentration of the organic base, viscosity stabilizer material. Therefore the concentration may vary from 5 ppm by weight to 20% by weight in the filled composition. As an example, for the viscosity stabilizer, benzyl-N,N'-dimethylamine (BDMA) the concentration is preferably less than 500 ppm by weight per one percent by weight of the photoacid precursor UVI-6974, Union Carbide, Danbury, Ct., in the overall filled composition. That is, a filled composition containing one percent by weight of the above photoacid precursor requires less than 500 ppm of BDMA. Further, a filled composition containing two percent by weight of the above photoacid precursor requires less than 1000 ppm of BDMA. More preferably, the concentration of BDMA, viscosity stabilizer material is in the range of about 5 to about 400 ppm by weight (stabilizer) per one percent by weight of photoacid precursor (UVI-6974) and most preferably in the range of about 5 to about 250 ppm by weight (stabilizer) per one percent by weight of photoacid precursor, in the overall filled composition. Preferably, the concentration of benzyl-N,N'-dialkylamine viscosity stabilizers (having molecular weights close to that of BDMA) in the overall composition is in the range of about 5 to 5000 ppm by weight, more preferably in the range of about 30 to 1000 ppm by weight, in the overall filled composition. Concentration levels may vary from the values indicated in the above example as different members of the benzyl-N,N'-dialkylamine family are used. As their molecular weight increases, the concentration required to obtain a desired result typically increases. Benzyl-N,N-dialkyl-amines have been widely used as catalysts (polymerization promoters) at high concentrations. As an example BDMA has been widely used as a catalyst to crosslink epoxy systems at concentrations about or over 1% by weight. BDMA, however, has never been used as a viscosity stabilizer (polymerization inhibitor) for epoxy systems.

Depending on the initial viscosity of the overall composition, the most important factors for characterizing the stability and shelf life of a stereolithographic composition is the rate of viscosity increase, and absolute final value. The following table provides guidelines for determining whether a composition has acceptable viscosity stability when subjected to an accelerated thermal aging test at 65° C. for 25 days:

| Resin Class | viscosity range (cps @ SL part building temperatures) | | | |
| --- | --- | --- | --- | --- |
| | lower end of range | upper end of range | upper limit for stability | lower limit of unstability |
| very very low | 50 | 200 | 1000 | 3000 |
| very low | >200 | 700 | 2500 | 5000 |
| low | >700 | 2000 | 4500 | 9000 |
| medium | >2000 | 5000 | 8000 | 12000 |
| medium–high | >5000 | 10000 | 20000 | 30000 |
| high | >10000 | 20000 | 40000 | 5000 |
| very high | >20000 | solid | 300% | 600% |

The stereolithography user determines whether a filled composition subjected to accelerated thermal aging at 65° C. having viscosity that falls within a pseudo-stable range between the upper limit for stability and lower limit for unstability is suitable for general or specific stereolithographic applications. For general applications, the part building temperatures range between 20 and 45° C. However, substantially higher part building temperatures may be employed for specific stereolithographic applications highly depending on the chemical structure, physical and chemical properties of the base resin comprising the filled composition.

The radiation-curable compositions can also comprise further constituents usually employed in the art of photopolymerizable materials, for example inert solvents suitable for the particular components, reactive diluents, or conventional additives, such as stabilizers, for example, UV stabilizers, air release agents, wetting agents, flow-control agents, leveling agents, antisettling agents, defoamers, surfactants, dyes, or pigments. The additives are employed in each case in the effective amount for the desired purpose and can make up a total of, for example, up to 20 percent by weight of the overall compositions.

The stabilization process described herein is particularly suitable for use in stereolithography. An aspect of the present invention therefore relates to a process for the production of three-dimensional articles by stereolithography using a radiation-curable composition comprising a cationically polymerizable compound and a photoinitiator for cationic polymerization, in which either an organic base stabilizer material is brought into contact with the composition or at least one filler material is added which functions, as least in part, as a viscosity stabilizer.

A viscosity stabilizer delays or prevents the increase in viscosity of the composition that results from the presence of free acid in regions of the formulation outside of those where polymerization and hardening of the composition is desired, that is outside of the exposed or imaged regions of the liquid composition.

The necessity for viscosity stabilization is most important in stereolithography process systems wherein the curable compositions are stored in deep vats for long periods of time. Without intending to be bound to any theory, during the stereolithography process, at some point beyond the laser beam diameter, the degree of laser beam exposure, while still capable of generating acid, does not generate a large enough concentration of acid to polymerize the epoxy to the point of gelation. This limited exposure acid is free to migrate throughout the vat and initiate polymerization, which may lead to a viscosity increase of the composition. The acid that is produced and which does not cause significant gellation or hardening of the epoxy creates the greatest problem of composition instability. This acid is mobile within the composition and is capable of initiating many epoxy reactions throughout the composition.

In a first embodiment of the present invention, the radiation-curable composition comprises a cationically polymerizable compound, a filler material, a photoinitiator for cationic polymerization and an organic base, viscosity stabilizer material in an amount sufficient to stabilize the overall composition.

In a second embodiment of the present invention, the radiation-curable composition comprises a cationically polymerizable compound, at least one filler material that functions at least as a viscosity stabilizer, optionally, a mixture of other acidic or basic filler materials and a photoinitiator for cationic polymerization. The ratio of the viscosity stabilizer filler material(s) and the rest of the filler materials of the mixture can be experimentally adjusted to produce an overall composition that shows improved viscosity stability. This filled composition is stabilized due to the existence of the filler material(s) that function at least as viscosity stabilizer(s), and frequently do not require addition of an organic base stabilizer material. A particularly preferred filler for stabilizing the stereolithographic compositions is Feldspar, Minspar 7, which is an alkali-aluminosilicate. Alumina trihydrate, SF4 can also be used for this purpose. An organic base, viscosity stabilizer material can optionally be further incorporated, if desired.

Liquid curable compositions which are particularly suitable for stereolithography in this case are based, in particular, on liquid epoxy resins or vinyl ethers as cationically curable compounds. The particularly preferably compositions are hybrid systems, i.e. compositions which contain at least one compound which can be cured by means of free radicals and a free-radical polymerization photoinitiator which is suitable therefor, as well as the cationically curable components. Such hybrid systems are described, for example, in EP-A-0360869 and EP-A-0605361, whose descriptions should be regarded as part of this description and are incorporated herein by reference.

The compounds which can be polymerized by means of free radicals can be used, for example, in amounts of from 0 to 80 percent by weight, based on the total composition. For example, the composition can comprise from 1 to 30 percent by weight of components which can be cured by means of free radicals and from 70 to 95 percent by weight of cationically curable components. The compounds which can be polymerized by means of free radicals are frequently monoacrylates, diacrylates and polyacrylates having an acrylate functionality of up to 9 or corresponding methacrylates, or vinyl compounds having a vinyl functionality of up to 6.

Examples of suitable mono(meth)acrylates are acrylate, allyl methacrylate, methyl, ethyl, n-propyl, n-butyl, isobutyl, n-hexyl, 2-ethylhexyl, n-octyl, n-decyl and n-dodecyl acrylate and methacrylate, 2-hydroxyethyl, 2- and 3-hydroxypropyl acrylate and methacrylate, 2-methoxyethyl, 2-ethoxyethyl and 2- or 3-ethoxypropyl acrylate, tetrahydrofurfuryl methacrylate, 2-(2-ethoxyethoxy)ethyl acrylate, cyclohexyl methacrylate, 2-phenoxyethyl acrylate, glycidyl acrylate and isodecyl acrylate, and examples of suitable mono-N-vinyl compounds are n-vinylpyrrolidone and N-vinylcaprolactam. Such products are also known and some are commercially available, for example from the SARTOMER Company, Exton, Pa.

Examples of suitable additional di(meth)acrylates are the di(meth)acrylates of cycloaliphatic or aromatic diols, such as 1,4-dihydroxymethylcyclohexane, 2,2-bis(4-hydroxycyclohexyl)propane, bis(4-hydroxycyclohexyl) methane, hydroquinone, 4,4'-dihydroxybiphenyl, bisphenol A, bisphenol F, bisphenol S, ethoxylated or propoxylated bisphenol A, ethoxylated or propoxylated bisphenol F or ethoxylated or propoxylated bisphenol S. Such di(meth) acrylates are known, and some are commercially available.

The di(meth)acrylates can also be compounds of the formulae (5), (6), (7) or (8)

in which $S_1$ is a hydrogen atom or methyl, $Y_1$ is a direct bond, $C_1$–$C_6$alkylene, —S—, —O—, —SO—, —SO$_2$— or —CO—, $S_{10}$ is a $C_1$–$C_8$alkyl group, a phenyl group which is unsubstituted or substituted by one or more $C_1$–$C_4$alkyl groups, hydroxyl groups or halogen atoms, or a radical of the formula —CH$_2$—OS$_{11}$, in which $S_{11}$ is a $C_1$–$C_8$alkyl group or a phenyl group, and $A_1$ is a radical selected from the radicals of the formulae:

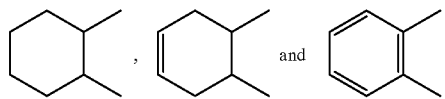

The di(meth)acrylates of the formulae (5) and (6) are known, and some are commercially available, for example under the name SR®349 and Novacure®3700, and can be prepared by reacting ethoxylated bisphenols, in particular ethoxylated bisphenol A, or bisphenol diglycidyl ethers, in particular bisphenol A diglycidyl ether, with (meth)acrylic acid.

In the same way, compounds of the formulae (7) and (8) can be prepared by reacting a diglycidyl ether of the formula (7a):

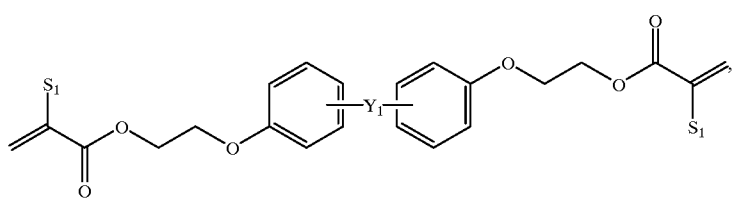

(5)

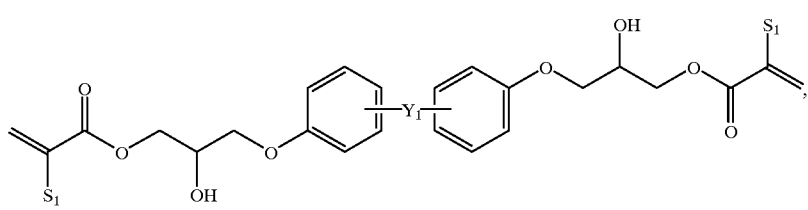

(6)

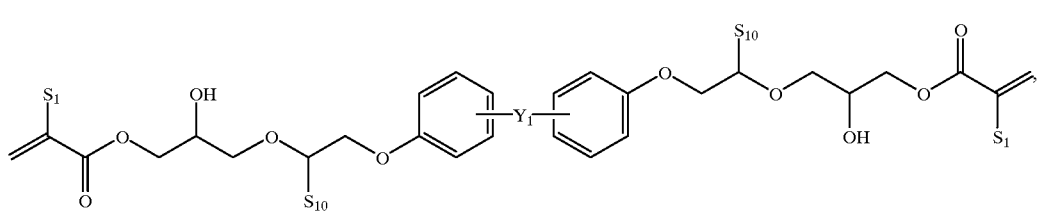

(7)

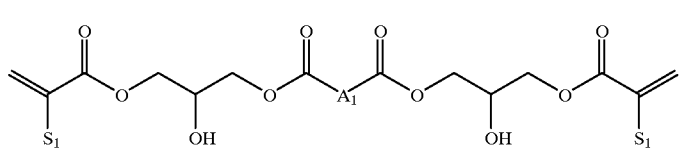

(8)

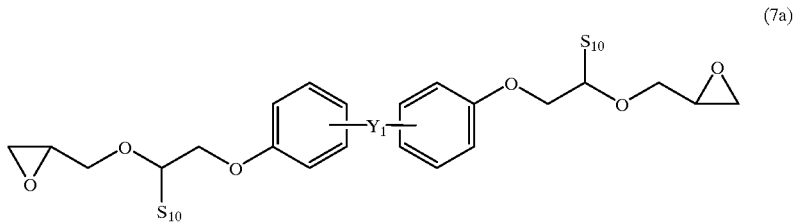
(7a)
or a diglycidyl ester of the formula (8a):
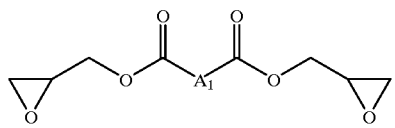
(8a)
where $S_{10}$, $Y_1$ and $A_1$ are as defined above, with (meth) acrylic acid.
The diacrylates can furthermore be a compound of the formula (9), (10), (11) or (12)
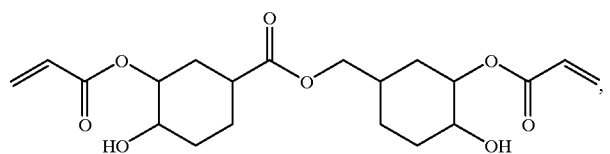
(9)
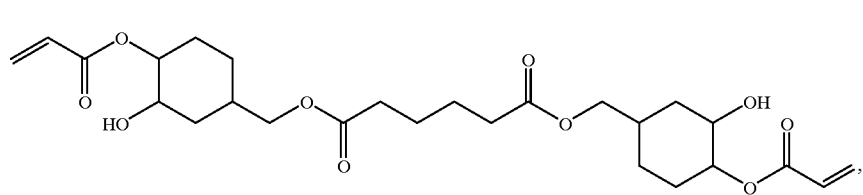
(10)
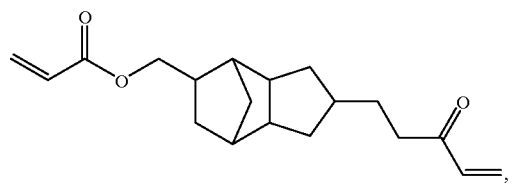
(11)
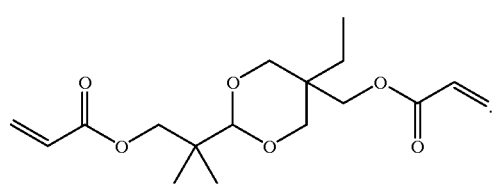
(12)

These compounds are known, and some are commercially available. The compounds of the formulae (9) and (10) can be prepared in a known manner by reacting the cycloaliphatic diepoxides of the formula (9a) or (10a)

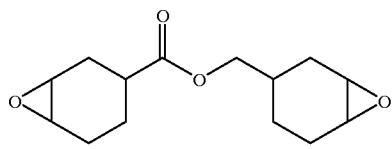

(9a)

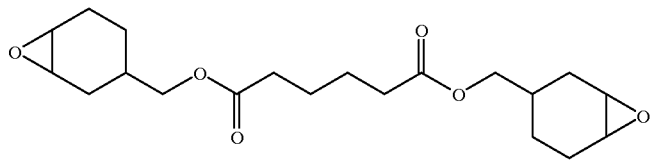

(10a)

respectively with (meth)acrylic acid. The compound of the formula (12) is commercially available under the name Kayarad®R-604.

Examples of suitable additional poly(meth)acrylates are monomeric or oligomeric aliphatic, cycloaliphatic or aromatic acrylates or methacrylates having a (meth)acrylate functionality of greater than 2, in particular tri-, tetra- or pentafunctional acrylates or methacrylates.

Examples of suitable aliphatic polyfunctional (meth)acrylates are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates obtained by reacting triepoxide compounds, for example the triglycidyl ether of said triols, with (meth)acrylic acid. It is also possible to use, for example, pentaerythritol tetraacrylate, bistrimethylolpropane tetraacrylate, pentaerythritol monohydroxytriacrylate or -methacrylate or dipentaerythritol monohydroxypentaacrylate or -methacrylate.

In some preferred compositions, the further compounds which can be polymerized by means of free radicals can also be hexafunctional or polyfunctional urethane acrylates or urethane methacrylates. These urethane (meth)acrylates are known to the person skilled in the art and can be prepared in a known manner, for example by reacting a hydroxy-terminated polyurethane with acrylic acid or methacrylic acid or by reacting an isocyanate-terminated prepolymer with hydroxyalkyl (meth)acrylates.

Examples of suitable tri(meth)acrylates are the products of the reaction of triglycidyl ethers of trihydric phenols and phenol- or cresol-novolaks containing three hydroxyl groups with (meth)acrylic acid.

Some preferred compositions comprise at least one (meth)acrylate having an acrylate functionality of from 1 to 9 which is soluble in the composition; they particularly preferably comprise a liquid mixture of aromatic, aliphatic or cycloaliphatic (meth)acrylates having an acrylate functionality of from 2 to 9.

Other suitable photoinitiators for free-radical polymerization are all compound types which form free radicals on appropriate irradiation. Typical compounds of known photoinitiators are benzoins, such as benzoin, benzoin ethers, such as benzoin methyl ether, benzoin ethyl ether, benzoin isopropyl ether and benzoin phenyl ether, and benzoin acetate, acetophenones, such as acetophenone, 2,2-dimethoxyacetophenone and 1,1-dichloroacetophenone, benzil, benzil ketals, such as benzil dimethyl ketal and benzil diethyl ketal, anthraquinones, such as 2-methylanthraquinone, 2-ethylanthraquinone, 2-tert-butylanthraquinone, 1-chloroanthraquinone and 2-amylanthraquinone, furthermore triphenylphosphine, benzoylphosphine oxides, for example 2,4,6-trimethylbenzoyldiphenylphosphine oxide (Luzirin TPO), benzophenones, such as benzophenone and 4,4'-bis(N,N'-dimethylamino)benzophenone, thioxanthones and xanthones, acridine derivatives, phenazine derivatives, quinoxaline derivatives and 1-phenyl-1,2-propanedione 2-O-benzoyl oxime, 1-aminophenyl ketones and 1-hydroxyphenyl ketones, such as 1-hydroxycyclohexyl phenyl ketone, phenyl 1-hydroxyisopropyl ketone and 4-isopropylphenyl 1-hydroxyisopropyl ketone, all of which are known compounds.

Particularly suitable photoinitiators, which are usually used in combination with an He/Cd laser, preferably operating at a wavelength of 325 nm, as light source, are acetophenones, such as 2,2-dialkoxybenzophenones and 1-hydroxyphenyl ketones, for example 1-hydroxycyclohexyl phenyl ketone and 2-hydroxyisopropyl phenyl ketone (2-hydroxy-2,2-dimethylacetophenone), in particular 1-hydroxycyclohexyl phenyl ketone.

Another class of free-radical photoinitiators usually employed when argon ion lasers, preferably operating at a wavelength of 351 nm, or solid state lasers, preferably operating at a wavelength of 355 nm, are used are benzil ketals, for example benzil dimethyl ketal. The photoinitiator is in particular an α-hydroxyphenyl ketone, benzil dimethyl ketal or 2,4,6-trimethylbenzoyldiphenylphosphine oxide.

Another class of suitable free-radical photoinitiators comprises the ionic dye counterion compounds, which are capable of absorbing actinic radiation and generating free radicals which initiate the polymerization of substances such as (meth)acrylates or vinyl compounds. The novel mixtures comprising ionic dye-counterion compounds can be cured variably in this way using visible light in the adjustable wavelength range from 400 to 700 nm. Ionic dye-counterion compounds and their mode of action are known, for example from EP-A-O223587 and U.S. Pat. No. 4,751,102; 4,772,530 and 4,772,541. Examples which may be mentioned of suitable ionic dye-counterion compounds are the anionic dye-iodonium ion complexes, the anionic dye-pyryllium ion complexes and in particular the cationic dye-borate anion compounds of the formula

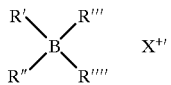

in which $X^+$ is a cationic dye, and R', R", R'" and R"", independently of one another, are each an alkyl, aryl, alkaryl, allyl, aralkyl, alkenyl, alkynyl, alicyclic or saturated or unsaturated heterocyclic group.

It is known to the person skilled in the art that suitable photoinitiators must be selected for each chosen light source or, if appropriate, sensitized thereto. It has been recognized that the depth of penetration of the radiation (i.e., distance in which intensity of radiation drops by factor of 1/e) into the composition to be polymerized and the working curve are inversely proportional with the absorption coefficient and the concentration of the photoinitiator. In stereolithography, preference is given to photoinitiators which cause the maximum number of free radicals or cationic particles to be formed for a certain laser energy, so that a preform (i.e. green part) of optimum strength is formed at the set curing depth. Both cationic and free-radical photoinitiators are added to the stereolithography mixtures in effective amounts, in particular in each case in amounts of from about 0.1 to about 10 percent by weight, based on the total weight of the mixture, it being essential, in particular, when lasers are used for the radiation curing, that the absorption ability of the mixtures is adjusted through the type and concentration of the photoinitiator so that the curing depth is from about 0.1 to 2.5 mm. The total amount of photoinitiators in the preferred compositions is preferably from 0.5 to 6.5 percent by weight.

It is of course also possible for the usual additives in this technology to be present in the stereolithography baths for the present invention. These are, for example, the above-mentioned additives or additional crosslinking agents, such as diols or polyols.

In preferred embodiments, the viscosity of the overall composition is preferably less than 10,000 cps, more preferably between about 200 and 5,000 cps at part building temperatures (approximately 20–45° C.). Although the preferred part building temperatures are 20–45° C., the temperature may extend outside of this range.

Though the discussion hereinbefore and the examples hereinafter are primarily directed to stereolithographic formation of three dimensional objects using radiation curable compositions, it will be understood by those of skill in the art that other forms of stereolithographic object formation can be utilized in conjunction with the instant invention. For example, the compositions may be thermally curable as opposed to photocurable. Such compositions would include thermal initiators, known to those skilled in the art, as opposed to photoinitiators.

The following examples illustrate the invention in greater detail.

EXAMPLE 1

Filled composition are prepared in a reaction vessel. The components are added in the following manner. In a base liquid resin LLS 71040 (available from Ciba Specialty Chemicals Corporation, Tarrytown, N.Y., which is very similar to LLS 71050, which is also available from Ciba Specialty Chemicals Corporation), the following components are added: TMN-6 (wetting agent, Union Carbide, Danbury Ct.) 0.25% by weight, SAG-47 (defoamer, Osi Chemicals, Corp., Ridgefield Park N.J.) 0.08% by weight, and, as noted in Table 1, BDMA (organic viscosity stabilizer). The resulting solution is stirred at room temperature for 30 min. Then the antisedimentation agent, Aerosil R972 (antisedimentation agent) is added as noted in Table 1. The mixture is again stirred at room temperature for 20 minutes prior to the addition of the filler material (Imsil A8) at 40% by weight. The filled compositions are stirred at room temperature for 30 minutes, followed by heating at 65° C. for 1.5 hours. The filled systems are further stirred overnight under moderate shear mixing. The experimental results are shown in Table 1.

The results shown in Table 1 below demonstrate that an organic base, viscosity stabilizer material, such as benzyl-N,N'-dimethylamine, BDMA, used at concentrations between 420 and 500 ppm (samples 116-43D and 43E) stabilizes the filled composition. However, the use of BDMA at levels lower than the optimum produces unstable filled compositions that are susceptible to gellation (samples 116-43AA through 116-43C).

EXAMPLE 2

Filled compositions are prepared in a reaction vessel. The components are added in the following manner. In a base liquid resin SL 5410 (available from Ciba Specialty Chemicals Corporation, Tarrytown, N.Y.,), the following components are added: TMN-6 (wetting agent) 0.35% by weight, SAG-47 (defoamer) 0.10% by weight, and BDMA (organic stabilizer), as noted in Table 2. The resulting solutions are stirred at room temperature for 30 min. Then Aerosil R972 (antisedimentation agent) is added at 2.5% by weight. The mixture is again stirred at room temperature for 20 minutes prior to the addition of the filler (Imsil A8). The filled compositions are stirred at room temperature for 30 minutes, followed by heating at 65° C. for 1.5 hours. The filled systems are further stirred overnight under moderate shear mixing. The experimental results are shown in Table 2.

The results shown in Table 2 further demonstrate that the organic viscosity stabilizer, BDMA, at 450–1200 ppm (samples 116-51F and 51J) stabilizes the filled composition. At lower concentrations, such as 50–300 ppm (samples 116-51A through 51E), the viscosity of the composition increases, and the filled composition is unworkable. In addition, at higher concentrations, the viscosity increases at an unacceptably high rate (unstable system) because BDMA works as a catalyst. This increase in viscosity instability is evidenced by 116-51H through 116-51J, though the examples still produce stable resins.

EXAMPLE 3

Filled compositions are prepared in a reaction vessel. The components are added in the following manner. In a base liquid resin SL 5170 (available from Ciba Specialty Chemicals Corporation, Tarrytown, N.Y.), the following components are added: TMN-6 (wetting agent) 0.10% by weight, SAG-47 (defoamer) 0.10% by weight, and, as noted in Table 3, BDMA (organic base stabilizer). The resulting solution is stirred at room temperature for 30 min. Then the antisedimentation agent, Aerosil R972 (antisedimentation agent) is added at 2% by weight. The mixture is again stirred at room temperature for 20 minutes prior to the addition of the filler material (Imsil A8 and Feldspar-Minspar 10 are added as noted in Table 3). The filled compositions are stirred at room temperature for 30 minutes, followed by heating at 65° C.

for 1.5 hours. The filled systems are further stirred overnight under moderate shear mixing. The experimental results are shown in Table 3.

Referring to Table 3, sample 116-13A, which contains 0.03% (300 ppm) BDMA, is completely stabilized. In the absence of the BDMA (sample 116-9A), the composition became unworkable after 7 days, and gelled after 14 days. By adding 1000–5000 ppm BDMA (samples 116-13B and 13C) the filled compositions are unstable and gel. The instability is believed to be due to the fact that at high BDMA concentrations, the BDMA works as a catalyst, thus initiating gellation reaction.

Table 3 further shows that by using a filled composition comprising at least one filler with pH value greater than 9 (Feldspar, Minspar 10—see samples 116-13D and 13E), the filled composition is stabilized even in the absence of an organic base stabilizer material. Without the addition of Minspar 10, the filled composition is unstable and becomes unworkable after 7 days at 65° C., and gels after 14 days at 65° C. (sample 116-9A). The stabilized samples (116-13D and 13E) show low, workable viscosities even after being heated at 65° C. for 39 days.

EXAMPLE 4

A filled composition is prepared in a reaction vessel. The components are added in the following manner. In a base liquid resin SL 5170, the following components are added: TMN-6 (wetting agent) 0.1% by weight and SAG-47 (defoamer) 0.10% by weight. The resulting solution is stirred at room temperature for 30 min. Then Aerosil R972 (antisedimentation agent) is added at 2% by weight. The mixture is again stirred at room temperature for 20 minutes prior to the addition of the mixture of fillers, Imsil A8 at 17% by weight and alumina trihydrate at 10% by weight. The filled composition is stirred at room temperature for 30 minutes, followed by heating at 65° C. for 1.5 hours. The filled system is further stirred overnight under moderate shear mixing. The viscosity measured at 22° C. was 2540 cps. The filled composition was aged at 65° C. for 18 days. During the aging the viscosity increased to 35,000 cps. The viscosity increase is too high for compositions suitable for stereolithographic applications. To overcome the problem with viscosity increase, BDMA was added (150 ppm) in a fresh composition. The new filled composition was aged at 65° C. for 18 days; the viscosity increase was minimal.

TABLE 1

| 1 Materials | Formulation name | | | | | | |
|---|---|---|---|---|---|---|---|
| | 115-28B | 116-43AA | 116-43A | 116-43B | 116-43C | 116-43D | 116-43E |
| 2 Base resin | 100.00 | 58.00 | 58.00 | 58.00 | 58.00 | 58.00 | 58.00 |
| 3 Wetting agent | | 0.25 | 0.25 | 0.25 | 0.25 | 0.25 | 0.25 |
| 4 Defoamer | | 0.08 | 0.08 | 0.08 | 0.08 | 0.080.08 | |
| 5 Imsil A-8, filler | | 40.00 | 40.00 | 40.00 | 40.00 | 40.00 | 40.00 |
| 6 BDMA, ppm | contains: 136 | contain. 79 | 46 + 79 = 125 | 106 + 79 = 185 | 225 + 79 = 304 | 341 + 79 = 420 | 421 + 79 = 500 |
| 7 Aerosil, R-972 | 0.00 | 2.00 | 2.00 | 2.00 | 2.00 | 2.00 | 2.00 |
| 8 viscosity just after complete mixing, at RT (22° C.) | 256 (25° C.) | 1840 | 2280 | 1920 | 2670 | 2590 | 2600 |
| 9 viscosity after standing at room temperature for 2 days, at RT (22° C.) | 256 (25° C.) | 1900 | 2290 | 3060 | 3510 | 2590 | 2620 |
| 10 viscosity aging at 65° C. for n days; measure at 22° C. | | | | | | | |
| 11 3 days | | ⅔ polymer. | ¼ polymer. | bottom ⅙ polymer. | ⅒ polymer. | 2670 | 2700 |
| 12 5 days | | completely polymerized-gelled | | | | 2840 | 2750 |
| 13 30 days | | | | | | 2890 | 2810 |

TABLE 2

| 1 Materials | Formulation name | | | | | | | | | | |
|---|---|---|---|---|---|---|---|---|---|---|---|
| | SL 5410 | 116-51A | 116-51B | 116-51C | 116-51D | 116-51E | 116-51F | 116-51G | 116-51H | 116-51I | 116-51J |
| 2 Base resin | 100.00 | 57.05 | 57.05 | 58.05 | 58.50 | 57.05 | 57.05 | 57.05 | 57.05 | 57.05 | 57.05 |
| 3 Wetting agent | | 0.35 | 0.35 | 0.35 | 0.35 | 0.35 | 0.35 | 0.35 | 0.35 | 0.35 | 0.35 |
| 4 Defoamer | | 0.10 | 0.10 | 0.10 | 0.10 | 0.10 | 0.10 | 0.10 | 0.10 | 0.10 | 0.10 |
| 5 Imsil A-8 | | 40.00 | 40.00 | 40.00 | 40.00 | 40.00 | 40.00 | 40.00 | 40.00 | 40.00 | 40.00 |
| 6 BDMA, ppm | contains: 89 ppm (0.0089 g) | contains 50 ppm from the base resin | total 100 ppm | total 150 ppm | total 200 ppm | total 300 ppm | total 450 ppm | total 600 ppm | total 800 ppm | total 1000 ppm | total 1200 ppm |
| 7 Aerosil, R-972 | 0.00 | 2.50 | 2.50 | 2.50 | 2.50 | 2.50 | 2.50 | 2.50 | 2.50 | 2.50 | 2.50 |

TABLE 2-continued

| 1 Materials | SL 5410 | 116-51A | 116-51B | 116-51C | 116-51D | 116-51E | 116-51F | 116-51G | 116-51H | 116-51I | 116-51J |
|---|---|---|---|---|---|---|---|---|---|---|---|
| 8 viscosity after complete mixing, stirring at RT for 2.5 days; visc. measure at RT (22° C.) | 370 | 6350 | 5300 | 5880 | 6100 | 6510 | 7500 | 7490 | 6860 | 6100 | 5850 |
| 9 viscosity aging at 65° C. after n days; measure at 22° C. | | | | | | | | | | | |
| 10 14 days | | above 50000 | above 50000 | above 50000 | | above 40000 | | | | | |
| 11 25 days | | gelled | gelled | gelled | | | 7860 | 7580 | 8800 | 9320 | 9 |

TABLE 3

| 1 Materials | 116-9A | 116-13A | 116-13B | 116-13C | 116-13D | 116-13E |
|---|---|---|---|---|---|---|
| 2 Base resin | 63.00 | 63.00 | 634.00 | 62.50 | 63.00 | 63.00 |
| 3 Wetting agent | 0.10 | 0.10 | 0.10 | 0.10 | 0.10 | 0.10 |
| 4 Defoamer | 0.10 | 0.10 | 0.10 | 0.10 | 0.10 | 0.10 |
| 5 Aerosil, R-972 | 2.00 | 2.00 | 2.00 | 2.00 | 2.00 | 2.00 |
| 6 Imsil A-8, filler, pH ≅ 4–6 | 35.00 | 35.00 | 35.00 | 35.00 | 15.00 | 15.00 |
| 7 BDMA | | 0.03 | 0.10 | 0.50 | | |
| 8 Minspar 10, untreated, pH ≅ 9.2 | | | | | 20.00 | |
| 9 Minspar 10 + cycloepox. A-186 | | | | | | 20.00 |
| 10 Viscosity aging after 5 days at RT; measure at 22° C. | 1670 | 2310 | 2700 | 2240 | 2020 | 2000 |
| 11 Viscosity Aging at 65° C. after: | | | | | | |
| 12 2 days, in (cps) Check @ 22° C. | 4660 | 2340 | 2920 | GELLED | 2040 | 2010 |
| 13 7 days, in (cps) Check @ 22° C. | 33100 | 2350 | 6230 | | 2150 | 2100 |
| 14 14 days, in (cps) Check @ 22° C. | GELLED | | | | | |
| 15 25 days, in (cps) Check @ 22° C. | GELLED | 2390 | GELLED | GELLED | 2620 | 2350 |
| 16 39 days, cps, check at 22° C. | GELLED | 2650 | GELLED | GELLED | 4290 | 4110 |

*Unless otherwise indicated, constituents are shown in parts by weight.

What is claimed is:

1. A process for the production of three-dimensional articles by stereolithography comprising polymerizing sequential layers of a radiation-curable composition comprising a mixture of a cationically curing compound and a free-radical curing compound, at least one filler material and at least one photoinitiator for polymerization, to form a three dimensional article in which benzyl-N,N-dimethylamine is brought into contact with the composition at a concentration of 5 to 5000 ppm to delay or prevent a significant increase in viscosity of the overall composition.

2. A process according to claim 1, in which the mixture contains at least one compound having a 1,2-epoxide, a vinyl ether, lactone, acetal, cyclic sulfide, cyclic ether, or siloxane group.

3. A process according to claim 1, in which the concentration of BDMA is in the range of about 5 to 1000 ppm by weight, based on the weight of the composition.

4. A process according to claim 1, in which the radiation-curable composition comprises at least one compound which cures by means of free radicals or a mixture of two or more of said free radically-polymerizable compounds, and a photoinitiator for free-radical polymerization.

5. A process according to claim 1, in which at least one filler material has at least in part been surface treated with a compound-coupling agent that is either unreactive or capable of reacting when exposed to actinic radiation or free radicals.

6. A process for the production of three-dimensional articles by stereolithography comprising polymerizing sequential layers of a radiation-curable composition comprising a mixture of at least one radiation polymerizable compound, at least one filler material selected from sodium silicate, potassium silicate, calcium silicate, aluminum silicate, aluminum oxide, alumina trihydrate and mixtures thereof in an amount effective to delay or prevent a significant viscosity increase and at least one photoinitiator for polymerization to form a three-dimensional article.

7. A process according to claim 6, in which the radiation polymerizable compound is a cationically curing compound.

8. A process according to claim 6, in which the radiation polymerizable compound is a free radical curing compound.

9. A process according to claim 6 wherein the mixture further comprises tertiary amine, lactone, amide or urea derivative at a concentration of 5 to 5000 ppm.

10. A process according to claim 6, in which the cationically polymerizable compound in the radiation-curable composition is at least one compound containing at least a 1,2-epoxide, a vinyl ether, lactone, acetal, cyclic sulfide, cyclic ether or siloxane group.

11. A process according to claim 6, in which the radiation-curable composition comprises at least one compound which cures by means of free radicals or a mixture of two or more of said free radically-polymerizable compounds, and a photoinitiator for free-radical polymerization.

12. A process according to claim 6, wherein at least one of the at least one filler materials has a surface which is treated such that it undergoes reaction with at least one other compound in the mixture.

13. A process according to claim 12, wherein the surface has been treated to chemically or physically bond a coating material or coupling agent to the filler material.

14. A process according to claim 6, wherein at least one of the at least one filler materials has a surface which is treated with a non-reactive coating material.

15. A process according to claim 14, wherein the surface has been treated to chemically or physically bond a coating material to the filler material.

16. A process for the production of three-dimensional articles by stereolithography comprising polymerizing sequential layers of a radiation-curable composition comprising a mixture of at least one cationically polymerizable compound, and/or at least one free radically polymerizable compound, at least one filler material having a pH value equal to or greater than about 9 and at least one photoinitiator for cationic and/or radical polymerizations to form a three-dimensional article.

17. A process according to claim 16 wherein the radiation-curable composition further comprises at least one filler material having a pH value less than about 9.

18. A process according to claim 16, in which the cationically polymerizable compound in the radiation-curable composition is at least one compound containing at least a 1,2-epoxide, vinyl ether, lactone, acetal, cyclic sulfide, cyclic ether, or siloxane group.

19. A process according to claim 16, in which the radiation-curable composition further comprises at least one compound which cures by means of free radicals or a mixture of two or more of said free radically-polymerizable compounds, and a photoinitiator for free-radical polymerization.

20. A process according to claim 16, in which at least one filler material has at least in part been surface treated with a compound-coupling agent that is either unreactive or capable of reacting when exposed to actinic radiation or free radicals.

21. A process according to claim 16, in which a tertiary amine, lactone, amide or urea derivative is brought into contact with the composition.

22. A process for the production of three-dimensional articles by stereolithography comprising polymerizing sequential layers of a curable composition comprising a mixture of a cationically curing compound and a free-radical curing compound, at least one filler material and at least one initiator for polymerization to form a three-dimensional article, in which a sterically hindered tertiary benzyl-N,N'-amine or aryl-N,N'-amine at a concentration of 5 to 1000 ppm is brought into contact with the composition to delay or prevent a significant increase in viscosity of the overall composition.

* * * * *